US008643527B2

(12) United States Patent
Kosic

(10) Patent No.: US 8,643,527 B2
(45) Date of Patent: Feb. 4, 2014

(54) SWITCHED-CAPACITOR MDAC WITH COMMON-MODE HOP REGULATION

(75) Inventor: Stephen Robert Kosic, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 85 days.

(21) Appl. No.: 13/399,843

(22) Filed: Feb. 17, 2012

(65) Prior Publication Data

US 2013/0214944 A1 Aug. 22, 2013

(51) Int. Cl.
*H03M 1/38* (2006.01)

(52) U.S. Cl.
USPC .............................. 341/161; 341/155; 341/144

(58) Field of Classification Search
USPC .................................. 341/155, 163, 144, 161
See application file for complete search history.

(56) References Cited

U.S. PATENT DOCUMENTS

| 4,988,900 | A   | * | 1/1991  | Fensch         | 327/337 |
|-----------|-----|---|---------|----------------|---------|
| 5,563,597 | A   |   | 10/1996 | McCartney      |         |
| 7,026,968 | B1  |   | 4/2006  | Ali            |         |
| 7,432,844 | B2  | * | 10/2008 | Mueck et al.   | 341/163 |
| 8,223,053 | B2  | * | 7/2012  | Deval et al.   | 341/143 |
| 8,339,299 | B2  | * | 12/2012 | Quiquempoix et al. | 341/143 |
| 2010/0182176 | A1 |   | 7/2010  | Kawahito       |         |
| 2011/0148675 | A1 |   | 6/2011  | Zhao et al.    |         |

OTHER PUBLICATIONS

Analog Devices, "14-Bit, 20 MSPS/ 40 MSPS/ 65 MSPS/ 80 MSPS, 1.8 V Dual Analog-to-Digital Converter," AD9251 Datasheet, Rev. A, Oct. 2009.
Analog Devices, "16-Bit, 80 MSPS/ 105 MSPS/ 125 MSPS, 1.8 V Dual Analog-to-Digital Converter (ADC)," AD9268 Datasheet, Rev. A, Sep. 2009.
PCT International Search Report and Written Opinion for PCT/US2013/23791 mailed on Apr. 19, 2013.

* cited by examiner

*Primary Examiner* — Brian Young
(74) *Attorney, Agent, or Firm* — Kenyon & Kenyon, LLP

(57) ABSTRACT

A switched-capacitor digital-to-analog converter (DAC) circuit can include first and second sets of capacitors, an amplifier, a reference signal generator and interconnecting switches. The first and second sets of capacitors can be connected to first and second analog input signals responsive to a first clock signal, and to first and second reference voltages responsive to a second clock signal and digital control signals. The amplifier can be connected to the first and second sets of capacitors in response to the second clock signal. The reference signal generator can provide to the first and second sets of capacitors, responsive to the first clock signal, a common-mode reference signal to set a common-mode voltage at inputs of the amplifier, and can include components to replicate the operation of the first and second sets of capacitors. The switched-capacitor DAC circuit can be used to implement a multiplying DAC in a pipeline analog-to-digital converter.

23 Claims, 4 Drawing Sheets ued States Patent US 8,643,527 B2

SWITCHED-CAPACITOR MDAC WITH COMMON-MODE HOP REGULATION

BACKGROUND

Switched-capacitor techniques have been used to implement a wide variety of circuits. Classes of circuits that utilize these techniques include digital-to-analog converter (DAC) and analog to-digital converter (ADC) circuits. Many architectures exist for implementing both ADCs and DACs. One popular architecture is a pipeline ADC architecture. In a pipeline ADC, a plurality of pipeline stages are connected in series, and each stage converts an analog input signal to a corresponding digital output signal at an associated digital resolution. All but the last stage also reconvert the digital output to a corresponding analog output, and subtract the analog output from the analog input to generate an analog residue. An amplified version of this residue is fed to the next stage as its analog input. The digital outputs from all of the stages are combined to provide an overall digital output.

One implementation of a pipeline ADC involves using a switched-capacitor multiplying DAC (MDAC) to perform both the digital-to-analog reconversion and the subtraction of the resulting analog output from the analog input in a given pipeline stage. The MDAC typically samples the analog input signal during a first phase of a multi-phase clocking scheme, and then subtracts the analog output signal from the analog input signal during a second phase of the clocking scheme. The sampling of the analog input, and the subsequent generation and subtraction of the analog output from the analog input, can be accomplished using either the same or different capacitors in the MDAC. Efficiencies can be achieved by using the same capacitors to implement both of these functions, such as achieving an increased feedback factor, which in turn results in reduced noise, non-linearities, and circuit area.

However, the use of the same capacitors in the MDAC to accomplish both the sampling of the input signal and the generation and subtraction of the analog output from the analog input may also result in problems. Using the same set of capacitors in this way may result in a common mode voltage level change, also referred to as a common mode "hop," appearing at certain nodes of the circuit. For example, to sample the input signal, it may typically be applied to terminals of capacitors during the first active phase, and to generate and subtract the analog output signal from the analog input signal, selected reference voltages may be applied to these same terminals during the second active phase, based on the digital output generated by that stage. The sampled input signal and the selected reference voltages typically have different common mode values. As a result of the switched-capacitor nature of the circuit operation, this common mode voltage difference may result in movement of a common mode voltage appearing at an input of an amplifier of the MDAC. However, MDAC amplifiers often have stringent performance requirements, which translate into a relatively small preferred input common mode voltage ranges. Any deviation from this preferred common mode input range, such as due to an unfettered common mode hop, may undesirably reduce performance or increase design specifications of the MDAC and corresponding pipeline ADC.

Therefore, a need exists for switched capacitor circuits, including to implement MDACs for use in pipelined ADCs, that can utilize a common set of capacitors for multiple functions, such as for both sampling of an analog input signal and generation and subtraction of an analog output signal from the analog input signal, without incurring an undesirable common-mode voltages at the input of an amplifier of the switched-capacitor circuit.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

DETAILED DESCRIPTION

A switched-capacitor MDAC can implement conversion, subtraction and amplification components in a pipeline ADC stage. The MDAC can include first and second arrays of capacitor circuits, a feedback-configured amplifier, and a common-mode reference signal generator. The first and second capacitor circuit arrays can sample analog input signals during a sample phase, and generate and subtract analog output signals from the sampled input signals during a hold phase. The common-mode reference signal generator can generate a common mode reference signal for delivery to the first and second capacitor circuit arrays during the sample phase. The reference signal can have a value controlled to result in a selectable common-mode voltage being set at the inputs of the amplifier during the hold phase.

The common-mode reference signal delivered during the sample phase can account for differences between, and the time-wise variability of, analog input signals and digitally selected reference voltages received by the MDAC. To accomplish this, the reference signal generator can include scaled replicas of the first and second capacitor circuit arrays and other switches of the MDAC, as well as a feedback circuit. The replica components can receive the analog input signals and reference voltages, and be switched according to the sample and hold phases, as in the main MDAC circuit. The feedback circuit can regulate the common mode reference signal to have a value that sets the selected amplifier input common mode voltage in the main MDAC circuit.

Figure 1:
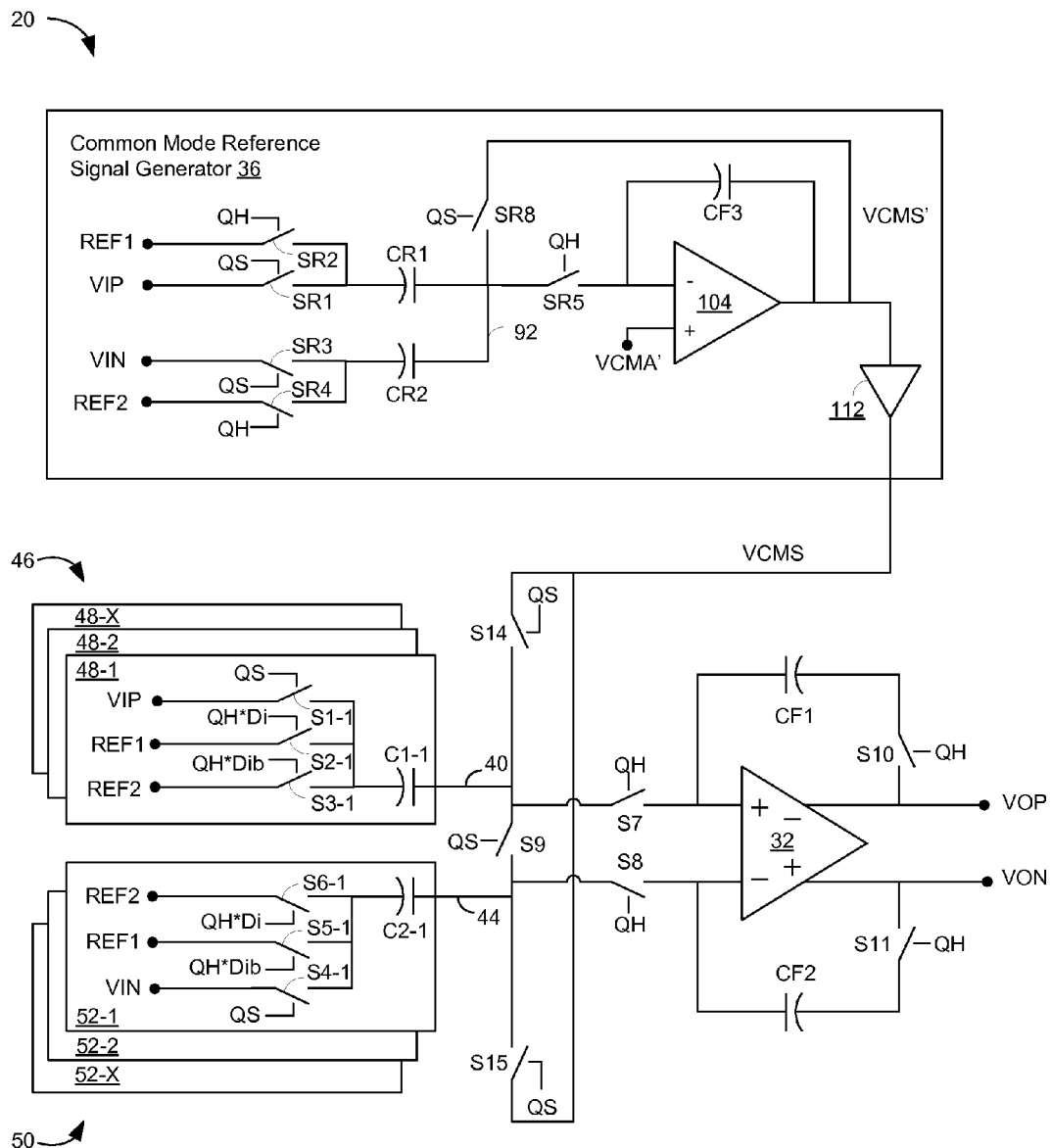
FIG. 1 is a circuit schematic depicting an embodiment of an MDAC.

FIG. 1 depicts an embodiment of the switched-capacitor MDAC 20 having common-mode voltage regulation. The MDAC 20 can include first and second arrays 46, 50 of capacitor circuits 48-1 ... 48-X, 52-1 ... 52-X, a feedback-configured amplifier 32, a common-mode reference signal generator 36, and interconnecting switches responsive to first and second clock signals QS, QH.

The capacitor circuits 48-1 ... 48-X, 52-1 ... 52-X can each include a capacitor C1-1 ... C1-X, C2-1 ... C2-X connected at a first terminal to a common node 40, 44 connected to the respective array 46, 50. Each capacitor C1-1 ... C1-X, C2-1 ... C2-X can also be connected at a second terminal to a positive or negative input signal VIP, VIN during a sample phase, and to a first or second reference voltage REF1, REF2 during a hold phase, by a respective plurality of switches S1-1-S3-1 ... S1-X-S3-X, S4-1-S6-1 ... S4-X-S6-X.

The feedback-configured amplifier 32 can include positive and negative inputs connected to the first and second common nodes 40, 44 through a pair of switches S8, S7, as well as a pair of feedback capacitors CF1, CF2 connected between outputs and inputs of the amplifier 32 through a pair of switches S11, S12. Outputs VOP, VON of the MDAC 20 can be taken from the amplifier outputs.

The common-mode reference signal generator 36 can generate and provide a common mode reference signal VCMS to the common nodes 40, 44, through a pair of switches S14, S15 during the sample phase. The common mode reference signal VCMS can have a value controlled by the reference signal generator 36 to produce a selectable common mode voltage VCMA' at the inputs of the amplifier 32 during the hold phase.

To perform this functionality, the common-mode reference signal generator 36 can replicate and regulate a characteristic charge conservation relationship of the capacitor circuit arrays 46, 50. The characteristic relationship of the capacitor circuit arrays 46, 50 exists between (i) the common mode voltage VCMI of the input signals VIP, VIN, and the common mode reference signal VCMS, during the sample phase, and (ii) the common mode voltage VCMR of the reference voltages REF1, REF2, and the common mode voltage VCMA of the amplifier input signals, during the hold phase, and can be expressed as: VCMI−VCMS=VCMR−VCMA.

The reference signal generator 36 can include replicas of the capacitors C1-1 ... C1-X, C2-1 ... C2-X and switches S1-1-S3-1 ... S1-X-S3-X, S4-1-S6-1 ... S4-X-S6-X of the capacitor circuit arrays 46, 50, as well as of the switches S7, S8 connecting these arrays 46, 50 to the amplifier 32. In FIG. 1, first and second replica capacitors CR1, CR2 can replicate the collective combination of the capacitors C1-1 ... C1-X, C2-1 ... C2-X of the first and second arrays 46, 50, respectively. A plurality of switches SR1, SR2, SR3, SR4 can replicate the switches S1-1-S3-1 ... S1-X-S3-X, S4-1-S6-1 ... S4-X-S6-X connecting the second terminals of the array capacitors C1-1 ... C1-X, C2-1 ... C2-X to the positive and negative inputs VIN, VIP and the reference voltages REF1, REF2. A switch SR5 can replicate the switches S7, S8 connecting the first and second common nodes 40, 44 to the inputs of the amplifier 32. The first and second replica capacitors CR1, CR2 can have first terminals connected to a common circuit node 92. Each of these replica components can be connected in a manner similar to as in the main MDAC circuit, and replicate the operation of the corresponding components.

The reference signal generator 36 can also include a feedback-configured amplifier 104 to regulate the generated common mode reference signal VCMS to have a value controlled to produce the desired amplifier common mode voltage VCMA' in the main MDAC circuit. A first feedback path can include a feedback capacitor CF3 connected between an output and a negative input of the amplifier 104. A second feedback path can deliver an output VCMS' from the amplifier 104 through a switch SR8 to the common node 92. A buffer 112 can provide a buffered version of the output VCMS' from amplifier output as the common mode reference signal VCMS generated by the reference signal generator 36. A positive input of the amplifier 104 can receive the desired amplifier input common mode voltage VCMA', which can optionally be either generated or received by the MDAC 20.

Figure 2:
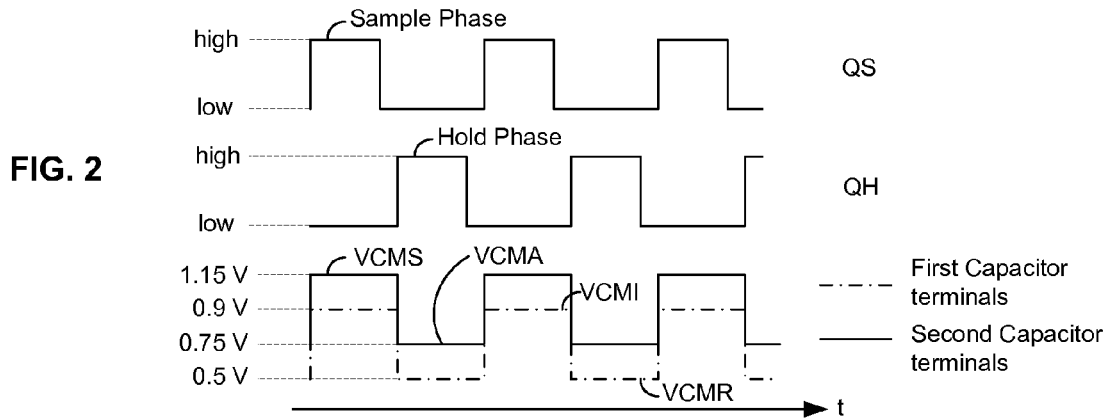
FIG. 2 is signal diagram depicting embodiments of clock and common mode signals of the MDAC of FIG. 1.

FIG. 2 depicts an exemplary embodiment of a multiphase clocking scheme and other signals of the MDAC 20, including a first clock signal QS, also referred to herein as the sample clock QS, having an active phase defining the sample phase of the clocking scheme, and a second clock signal QH, also referred to herein as the hold clock QH, having an active phase defining the hold phase of the clocking scheme.

Figure 3:
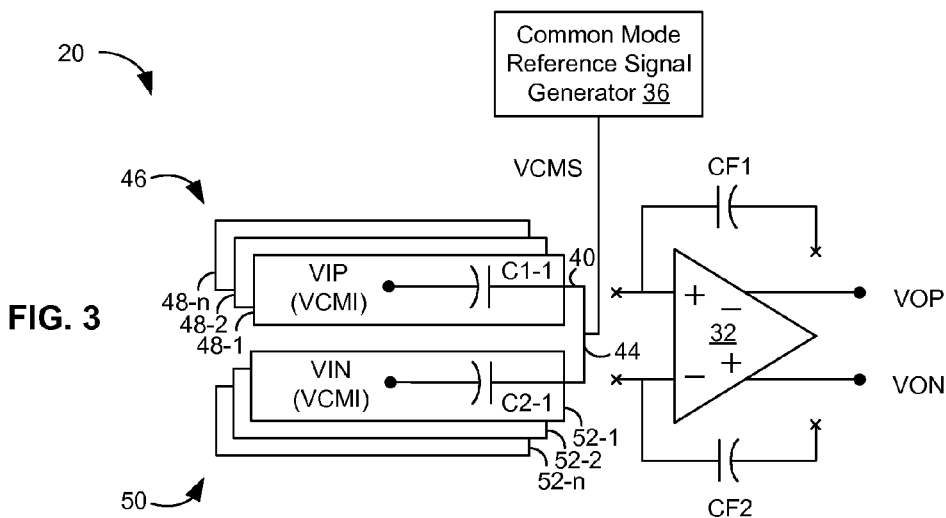
FIG. 3 is a circuit schematic depicting a representation of the MDAC of FIG. 1, showing an electrical configuration resulting from switching during a sample phase.

FIG. 3 depicts a simplified representation of an electrical configuration of the MDAC resulting from switching during the sample phase. As a result of receiving the sample clock QS, switches S1-1 ... S1-X, S4-1 ... S4-X, S14, S15 can electrically connect the positive and negative input signals VIP, VIN to the second terminals of capacitors C1-1 ... C1-X, C2-1 ... C2-X of the first and second arrays 46, 50, respectively, and electrically connect the common mode reference signal VCMS to the first and second common nodes 40, 44, which can be electrically connected together by the switch S9. Thus, at the end of the sample phase, the positive and negative input signals VIP, VIN can be sampled onto the second terminals of the first and second sets of capacitors C1-1 ... C1-X, C2-1 ... C2-X, respectively, and the common mode reference signal VCMS can be impressed upon the first terminals of all of these capacitors C1-1 ... C1-X, C2-1 ... C2-X. The amplifier 32 can be electrically disconnected from the capacitor circuit arrays 46, 50 during the sample phase.

From a common mode perspective, the second terminals of the capacitors C1-1 ... C1-X, C2-1 ... C2-X can all experience a same input common mode voltage VCMI from the positive and negative input signals VIP, VIN during the sample phase. This common mode input voltage VCMI can effectively be dictated by the input signals received by the MDAC, and as such may vary. As shown in FIG. 2, an exemplary embodiment of the input common mode voltage VCMI may have an exemplary value of 0.9 V. The first terminals of these capacitors C1-1 ... C1-X, C2-1 ... C2-X can all experience the common mode reference signal VCMS applied to these terminals during the sample phase, which can itself be a DC common mode voltage. As shown in FIG. 2, an exemplary embodiment of the common mode reference signal VCMS can have a value of 1.15 V, although other values may be produced by the reference signal generator 36 as a result of its regulation and control functionality.

Figure 4:
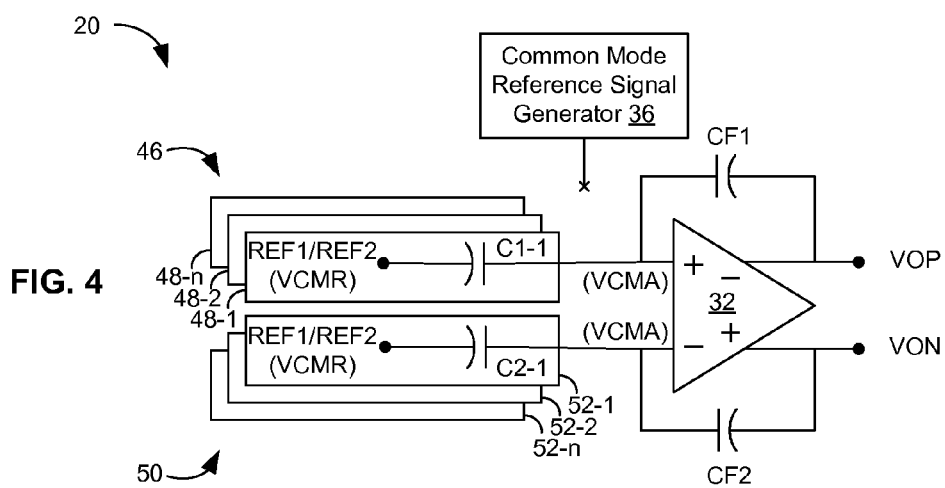
FIG. 4 is a circuit schematic depicting a representation of the MDAC of FIG. 1, showing an electrical configuration resulting from switching during a hold phase.

FIG. 4 depicts a simplified representation of an electrical configuration of the MDAC 20 resulting from switching during the hold phase. As a result of receiving the hold clock QH, switches S2-1 ... S2-X, S3-1 ... S3-X, S5-1 ... S5-X, S6-1 ... S6-X can electrically connect the second terminals of the capacitors C1-1 ... C1-X, C2-1 ... C2-X of the first and second arrays 46, 50 to either the first or second reference voltages REF1, REF2 based on respective digital control signals Di, Dib. Switches S7, S8, S10, S11 can electrically connect the first and second common nodes 40, 44, to the positive and negative inputs of the amplifier 32, and electrically connect the feedback capacitors CF1, CF2 to enable feedback about the amplifier 32. The common mode reference signal generator 36 can be electrically disconnected from the capacitor circuit arrays 46, 50 during the hold phase.

Each capacitor circuit of the first and second arrays can receive a unique digital control signal Di and its logical inverse Dib, which can be equivalent to or encoded based upon digital outputs DO produced by a pipeline ADC stage 64 that includes the MDAC 20, as discussed in more detail further below. Within the first array 46, the digital control signals Di, Dib can electrically connect a first number of the capacitors C1-1 . . . C1-X to the first reference voltage REF1 and a remaining second number of the capacitors C1-1 . . . C1-X to the second reference voltage REF2. In a complimentary manner, the digital control signals Di, Dib can electrically connect in the second array 50 the second number of the capacitors C2-1 . . . C2-X to the first reference voltage REF1 and the first number of the capacitors C2-1 . . . C2-X to the second reference voltage REF2. These connections can effectuate a generation and a subtraction of an analog output AO, produced by the pipeline stage 64 including the MDAC 20, from the input voltages VIP, VIN previously sampled onto the capacitors C1-1 . . . C1-X, C2-1 . . . C2-X during the sample phase.

Thus, during the hold phase, the second terminals of the capacitors C1-1 . . . C1-X, C2-1 . . . C2-X of the first and second arrays 46, 50 can all experience either the first or second reference voltages REF1, REF2. From a common-mode perspective, the second terminals of these capacitors C1-1 . . . C1-X, C2-1 . . . C2-X can each have the same common mode reference voltage VCMR, which can be the average of the first and second reference voltages REF1, REF2, as generally speaking, an equal number of capacitors within the capacitors C1-1 . . . C1-X, C2-1 . . . C2-X of the first and second arrays 46, 50 can be connected to the first reference voltage REF1 as can be connected to the second reference voltage REF2 during the hold phase as a result of the digital control signals Di, Dib. Returning to FIG. 2, if the first and second reference voltages REF1, REF2 have exemplary values of 1V and 0V, respectively, then the common mode reference voltage VCMR can have an exemplary value of 0.5V.

The common mode value of the voltage VCMA appearing at the positive and negative inputs of the amplifier 32 is not forced during the hold phase, and can instead be controlled by common mode reference signal VCMS during the sample phase, which itself can depend on the input common mode voltage VCMI during the sample phase and the common mode reference voltage VCMR during the hold phase. This can result from the characteristic relationship between these common mode quantities, VCMI−VCMS=VCMR−VCMA, as discussed above. More specifically, the reference signal generator 36 can generate a common mode reference signal VCMS having a value controlled to produce a selectable value VCMA' of the amplifier input common mode voltage VCMA, which accounts for variability in the input common mode voltage VCMI and common mode reference voltage VCMR. The selected value VCMA' of the amplifier input common mode voltage VCMA can be selected to conform to a desirable input common mode range specification of the amplifier 32. In FIG. 2, the selected value VCMA' of the amplifier input common mode voltage VCMA can have an exemplary value of 0.75V.

The characteristic relationship between the common mode quantities VCMI, VCMS, VCMR, VCMA can be derived from a charge conservation analysis, by equating the common mode charge on the capacitors C1-1 . . . C1-X, C2-1 . . . C2-X of the first and second arrays 46, 50 at the end of the sample phase with that at the beginning of the hold phase, and eliminating the capacitance values as constants. This charge conservation equality can result from the amplifier inputs presenting a high impedance to the common nodes 40, 44 during the hold phase, with the charge present on the capacitors at the end of the sample phase thus being preserved in the hold phase.

Figure 5:
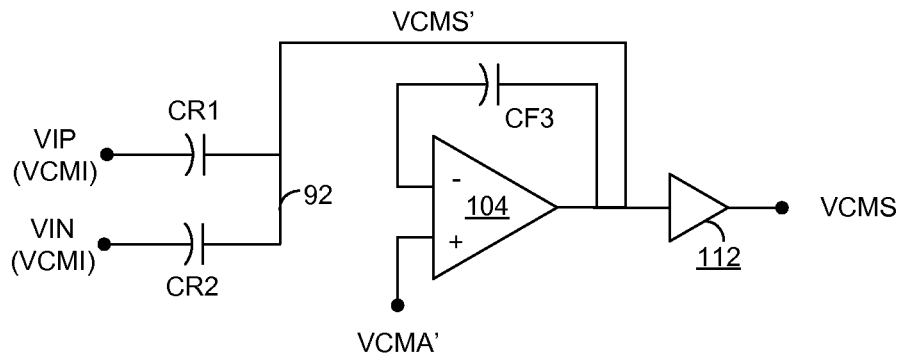
FIG. 5 is a circuit schematic depicting a representation of a common mode reference signal generator of FIG. 1, showing an electrical configuration resulting from switching during the sample phase.
Figure 6:
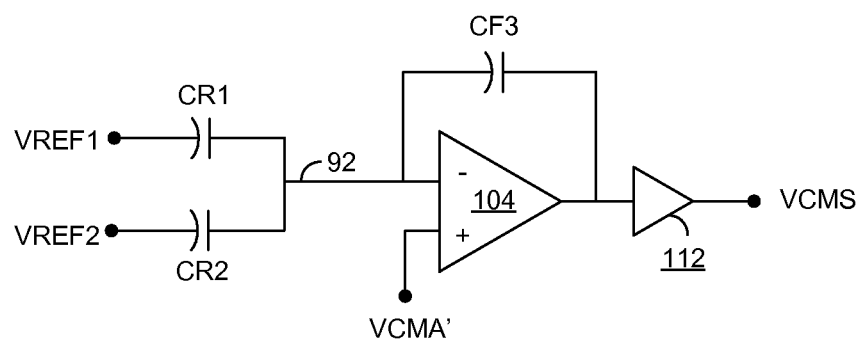
FIG. 6 is a circuit schematic depicting a representation of the common mode reference signal generator of FIG. 1, showing an electrical configuration resulting from switching during the hold phase.

In operation, the replica components of the common mode reference signal generator 36 can replicate the operation of the corresponding main MDAC components with respect to the characteristic common mode relationship to implement a corresponding replicated characteristic relationship in the reference signal generator 36. FIGS. 5 and 6 depict simplified representations of electrical configurations of the reference signal generator 36 resulting from switching during the sample and hold phases, respectively. During the sample phase, in FIG. 5, the second terminals of the replica capacitors CR1, CR2 can be electrically connected to the same positive and negative input signals VIP, VIN, respectively, delivered to the main MDAC circuit, which have the input common mode voltage VCMI, and a feedback path from the output of the amplifier 104 to the node 92 can deliver the amplifier output VCMS' to the first terminals of these capacitors CR1, CR2. During the hold phase, in FIG. 6, the second terminals of the first and second replica capacitors CR1, CR2 can be electrically connected to the same first and second reference voltages REF1, REF2, respectively, delivered to the main MDAC circuit. Common node 92 can be connected to the negative input of the amplifier 104. The reference signal generator 36 can receive the desired amplifier input common mode value VCMA' at the positive input of the amplifier 104.

The regulation by the reference signal generator 36 to generate the common mode reference signal VCMS can operate as follows. During a given hold phase, the signal generator amplifier 104 can produce an output VCMS' corresponding to both of its inputs being essentially at the desired amplifier input common mode voltage VCMA'. During a succeeding sample phase, this output VCMS' can be provided to first terminals of the replica capacitors CR1, CR2, and the input common mode voltage VCMI can be provided to the second terminals of these capacitors CR1, CR2. During the next hold phase, reapplication of the reference voltages REF1, REF2 to the second terminals of the replica capacitors CR1, CR2 can replicate application of the common mode reference voltage VCMR to the second terminals of the array capacitors C1-1 . . . C1-X, C2-1 . . . C2-X of the main MDAC circuit, and change the common mode at the replica capacitor second terminals, with the result that, due to charge conservation, the common mode at the first terminals of the replica capacitors CR1, CR2 can also shift. Ideally, the amplifier output VCMS' provided during the previous sample phase would result, after this common mode shifting, in the desired amplifier common mode value VCMA' appearing on the first terminals of the replica capacitors CR1, CR2 and the amplifier negative input during this hold phase. However, if the previously provided output VCMS' was not quite the correct value, then during the hold phase the amplifier 104 can integrate any error signal between the amplifier inputs to produce a new output VCMS', and corresponding common mode reference signal VCMS, which is closer to the correct value. After a sufficient number of cycles, this feedback operation can produce a common mode reference signal VCMS that produces the desired amplifier input common mode voltage VCMA' at the negative input of the signal generator amplifier 104. This common mode reference signal VCMS can also produce the desired amplifier input common mode voltage VCMA' at the inputs of the main MDAC amplifier 32 due the analogous operation of the main MDAC circuit and the replicated components in the reference signal generator 36 during the sample and hold phases.

The replica components can replicate the operation of the corresponding components in the main MDAC circuit by just having similar interconnections and being of the same type of circuit element as those that they replicate. The replica components can also replicate the corresponding MDAC main circuit components to a more exacting extent by being scaled-down copies of the same circuit implementations of their corresponding components.

Each of the first and second replica capacitors CR1, CR2 can have a capacitance value scaled-down in comparison to the total added capacitance of the capacitors of the first and second capacitor-circuit arrays 46, 50 of the main MDAC circuit, respectively. The first replica capacitor CR1 can have a capacitance value CR1=CT1/K1, and the second replica capacitor can have a capacitance value CR2=CT2/K1, where K1 is a common scaling factor having a value greater than one, CT1 is the total added capacitance value of the capacitors of the first array 46, i.e., CT1=C1-1+C1-2+ . . . C1-X, and CT2 is a similarly composed total capacitance value of the capacitors of the second array 50 of the main MDAC circuit. Each of the first and second replica capacitors CR1, CR2 can also be implemented using the same type of integrated circuit capacitor structure as each of the capacitors of the first and second capacitor-circuit arrays 46, 50.

Each of the pluralities of switches connected to the second terminals of the first and second capacitors CR1, CR2, and the switch SR5 connected to the first terminals of these capacitors CR1, CR2, can have a circuit implementation replicating that of the corresponding switches in the main MDAC circuit, although with component sizes proportionately scaled down in comparison to those of the main MDAC circuit.

Figure 7:
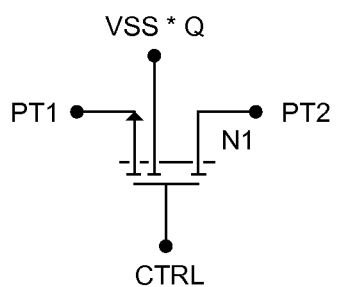
FIG. 7 is a circuit schematic depicting an embodiment of a transistor implementation of switches of the MDAC.
Figure 8:
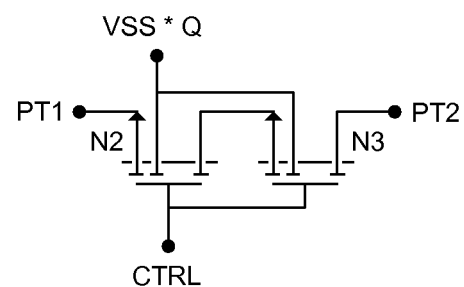
FIG. 8 is a circuit schematic depicting another embodiment of a transistor implementation of switches of the MDAC.

Switches can be implemented using a wide variety of transistor-based circuits. FIGS. 7 and 8 depict two exemplary embodiments of transistor switch implementations. In FIG. 7, a switch implementation can include a single NMOS transistor N1, with its source and drain acting as pass-through terminals PT1, PT2, and a gate acting as a control terminal CTRL, of the implemented switch. In FIG. 8, a switch implementation can include a plurality of NMOS transistors N2, N3 connected in series, with a source of one of the transistors N2 and a drain of another of the transistors N3 acting as pass-through terminals PT1, PT2, and connected gates acting as a control terminal CTRL, of the implemented switch. In both FIGS. 7 and 8, the NMOS transistors N1, N2, N3 can have backgates connected to a lower power supply VSS, or a clocked lower power supply VSS*Q. Many other switch implementations are also possible, such as either or both of NMOS or PMOS transistors, connected in parallel, in series, or in various combinations thereof, and having various well or substrate connections.

A switch implementation can be characterized by an effective length and an effective width of the combination of transistors implementing the switch. For a single transistor implementation, as in FIG. 7, the effective width and effective length can be the width of and length of the single transistor. For a series combination of same-width transistors, as could be the case in FIG. 8, the effective width can be the width of each of the transistors, and the effective length can be the sum of the lengths of each of the transistors of the series combination. For a parallel combination of same-length transistors, the effective length can be the length of each of the transistors, and the effective width can be the sum of the widths of each of the transistors of the parallel combination.

Each of the replica switches of the reference signal generator 36 can be implemented using the same transistor implementation architecture as the corresponding switch of the main MDAC circuit, such as, e.g., the switch embodiments of FIG. 7 or 8 or any other switch embodiment.

Each of the replica switches of the reference signal generator 36 can also have an effective width and length proportionately scaled down in comparison to the corresponding switch of the main MDAC circuit. The replica switches SR1, SR3 connecting the first and second replica capacitors CR1, CR2 to the positive and negative inputs VIP, VIN in can each have effective widths WR1=W1/K2, and effective lengths LR1=L1/K2, where W1 and L1 are the effective width and length of each of the switches S1-1 . . . S1-X, S4-1 . . . S4-X connecting the capacitors of the first and second capacitor-circuit arrays 46, 50 to the positive and negative input signals VIP, VIN in the main MDAC circuit, and K2 is a scaling factor having a value greater than one. The replica switches SR2, SR4 connecting the first and second replica capacitors CR1, CR2 to the first and second reference voltages REF1, REF2 can each have effective widths WR2=W2/K2, and lengths LR2=L2/K2, where W2 and L2 are the effective width and length of each of the switches S2-1 . . . S2-X, S3-1 . . . S3-X, S5-1 . . . S5-X, S6-1 . . . S6-X connecting the capacitors of the first and second capacitor-circuit arrays 46, 50 to the first or second reference voltages REF1, REF2 in the main MDAC circuit. The replica switch SR5 connected to the node 92 can have an effective width WR3=W3/K2, and effective length LR3=L3/K2, where W3 and L3 are the effective width and length of each of the switches S7, S8 connecting the first and second common nodes 40, 44 to the inputs of the MDAC amplifier 32 in the main MDAC circuit. In one embodiment, the scaling factor K2 used to scale the replica switches can have the same value as the scaling factor K1 used to scale the replica capacitors CR1, CR2.

Figure 9:
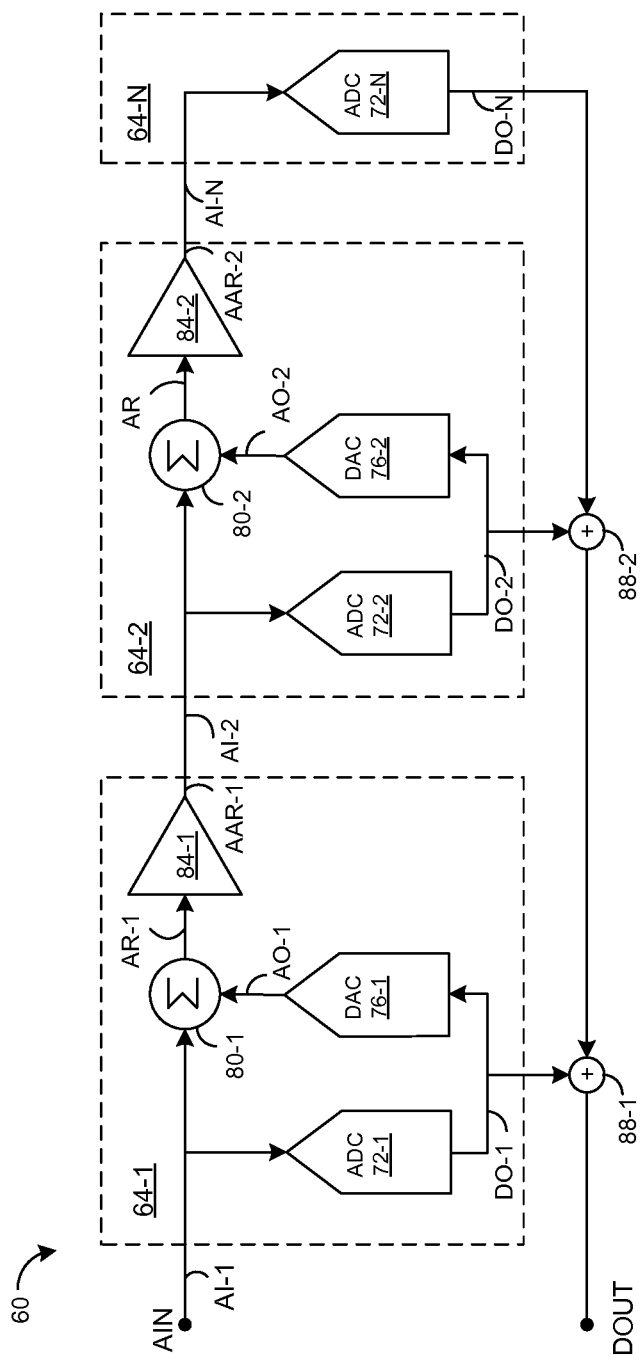
FIG. 9 is a circuit schematic depicting an embodiment of a pipeline ADC that can include the MDAC.

The MDAC 20 can be included in one or more stages of a pipelined ADC. FIG. 9 depicts an embodiment of a pipelined ADC 60 having a plurality of pipeline stages 64-1 . . . 64-N connected in series. A first stage 64-1 can receive the overall analog input signal AIN to the ADC 60, and produce a corresponding digital output DO-1, analog residue AR-1, and amplified analog residue AAR-1. A second stage 64-2 can receive as its analog input signal AI-2 the amplified analog residue AAR-1 generated by the first stage 64-1, and produce a corresponding digital output DO-2 and amplified analog residue AAR-2. An Nth stage 64-N can receive as its analog input AI-N the amplified analog residue AAR-N-1 (e.g., AAR-2 in FIG. 9) generated by the previous stage 64-N-1 (e.g., 64-2 in FIG. 9), and produce a corresponding digital output DO-N. The first and second stages 64-1, 64-2 can be non-final stages in the pipeline 60, and produce amplified analog residues MR to be passed to succeeding stages. The Nth stage 64-N can be the final stage of the pipeline 60, and may produce no residue, as the overall analog input AIN can have been fully converted to a digital representation after processing by the plurality of stages 64-1 . . . 64-N.

Each of the non-final pipeline stages 64-1 . . . 64-N-1 can include an ADC 72-1 . . . 72-N-1, a DAC 76-1 . . . 76-N-1, a subtraction circuit 80-1 . . . 80-N-1, and a residue amplifier 84-1 . . . 84-N-1. The ADC 72-1 . . . 72-N-1 can receive the analog input AI-1 . . . AI-N-1 to that stage and convert the received analog input AI-1 . . . AI-N-1 to a corresponding digital output DO-1 . . . DO-N-1 having an respective resolution. The ADC 72-1 . . . 72-N-1 can take the form of any of a variety of ADC architectures, such as flash, switched-capacitor, or other ADC architectures. The DAC 76-1 . . . 76-N-1 can receive the generated digital output DO-1 . . . DO-N-1 and reconvert that signal back to the analog domain to generate the analog output AO-1 ... AO-N-1. The subtraction circuit 80-1 ... 80-N-1 can receive the analog input AI-1 ... AI-N-1 and the analog output AO-1 ... AO-N-1 and generate an analog residue AR-1 ... AR-N-1 as a subtraction of the analog output AO-1 ... AO-N-1 from the analog input AI-1 ... AI-N-1. The residue amplifier 84-1 ... 84-N-1 can then amplify the analog residue AR-1 ... AR-N-1 to generate an amplified analog residue AAR-1 ... AR-N-1 to pass to the next stage as its analog input AI. The final pipeline stage 64-N can include an ADC 72-N to convert a received analog input AI-N to a corresponding digital output DO-N, and omit the DAC 76, subtraction circuit 80 and residue amplifier 84.

The pipeline ADC 60 can also include digital combination circuits 88-1 ... 88-N-1 to combine the plurality of digital outputs DO-1 ... DO-N produced by the plurality of pipeline stages 64-1 ... 64-N to form an overall digital output DOUT from the ADC 60. Each of the pipeline stages 64-1 ... 64-N can generate a corresponding digital output DO-1 ... DO-N having an associated digital resolution, and the digital output DO-1 ... DO-N generated by each pipeline stage 64-1 ... 64-N starting with the first stage 64-1 and ending with the last 64-N, can represent successively less significant portions of the overall digital output DOUT. The digital combiners 88-1 ... 88-N-1 can eliminate any intentional redundancy between the individual digital outputs DO-1 ... DO-N when generating the overall digital output DOUT.

Embodiments of the MDAC 20 can be used to implement the DAC 76, subtraction circuit 80 and residue amplifier 84 of a pipeline stage 64. As part of a pipeline stage 64, the positive and negative input voltages VIP, VIN received by the MDAC 20 can correspond to the analog input voltage AI delivered to a pipeline stage 64, the digital control signals Di, Dib can correspond to (or be based on or encoded from) the digital output DO generated by the ADC 72 of that stage 64, and the positive and negative analog outputs VOP, VON can correspond to the amplified analog residue MR generated by the stage 64.

Additional embodiments of the MDAC 20 and its common mode reference signal generator 36 are possible. Additional switches can also be added to the MDAC 20 to further implement functionality already discussed above, or to implement additional functionality not yet addressed. For example, a switch or a plurality of switches can be connected between the second terminals of the array capacitors C1-1 ... C1-X, C2-1 ... C2-X to reset the voltages of these terminals during a portion of the sample phase. Similarly, the MDAC 20 can also include switches connected to the first and second arrays 46, 50 of capacitor circuits 48-1 ... 48-X, 52-1 ... 52-X, and to the inputs and output of the amplifier 32, to implement a chopping functionality. Additional switches can also be added to deliver the common mode reference signal VCMS from the reference signal generator 36 to other nodes of the MDAC 20 during the sample phase, such as to the nodes connecting the feedback capacitors CF1, CF2 to the switches S10, S11. Further, switches can also be added to circuit paths of the common mode reference signal generator 36 to selectively improve or change its performance, such as another switch between the switch SR5 and the negative input of the amplifier 104, which can be enabled during the hold phase.

Although FIG. 9 depicts a pipeline ADC 60 having three pipeline stages 64-1 ... 64-N, other pipeline ADCs containing the MDAC 20 can have a different number of pipeline stages, with differing digital resolutions produced by each stage.

Other embodiments of the first and second arrays 46, 50 of capacitor circuits 48-1 ... 48-X, 52-1 ... 52-X are also possible, such as including differing numbers of capacitors, being configured to receive different types of digital control signals Di, Dib, such as control signals representing either a binary or thermometer encoding of the digital output DO, or having a different capacitor array architecture, such as including serial, parallel or combinations of serial and parallel arrangements of capacitors.

The voltage buffers 112 of the reference signal generator 36 can optionally be omitted. Additional voltage buffers can also optionally be added to the reference signal generator 36.

Different multiphase clocking schemes may also be used to control the MDAC 20, in addition to or instead of the clocking schemes described herein, such as may include more than two non-overlapping active phases, or which may include two or more overlapping or partially overlapping active phases. Additionally, embodiments of switches discussed herein may optionally be enabled by either logic high or logic low control or clock signals, as may result from the nature of specific transistor switch embodiments. The active phase of a given clock signal can correspond to either a logic-high (or relatively higher voltage level) or logic-low (or relatively lower voltage level) portion of the clock signal, and an inactive phase can complimentarily correspond to either a logic-low (or relatively lower voltage level) portion of the clock signal a logic-high (or relatively higher voltage level). The clocking scheme can also include other clock signals, which can have active phases variously aligned to or overlapping with the sample or hold phases or portions thereof.

Although transistor-based switch embodiments discussed herein may use NMOS transistors having deep n-well connections, any switches of the MDAC 20 may be implemented using any type of NMOS, PMOS or other type of transistor, having any type of terminal, well or substrate connections.

The first and second reference voltages REF1, REF2 can optionally be either generated or received by the MDAC 20 or a pipeline ADC including the MDAC 20.

Additional embodiments of the MDAC 20 are also possible. For example, any feature of any of the embodiments of the MDAC 20 described herein can optionally be used in or with any other embodiment of the MDAC 20. Embodiments of the MDAC 20 also optionally include any subset of the components or features of any embodiments of the MDAC 20 described herein.

What is claimed is:

1. A switched-capacitor digital-to-analog converter (DAC) circuit, comprising:
   first and second sets of capacitors, connected to first and second analog input signals in response to a first clock signal, and to first and second reference voltages in response to a second clock signal and digital control signals;
   an amplifier having inputs connected to the first and second sets of capacitors in response to the second clock signal; and
   a reference signal generator connected to the first and second sets of capacitors in response to the first clock signal, to provide a common-mode reference signal during an active phase of the first clock signal to set a common-mode voltage on the first and second capacitors and at the amplifier inputs during an active phase of the second clock signal to a selectable voltage.

2. A switched-capacitor digital-to-analog converter (DAC) circuit, comprising:
   first and second sets of capacitors, connected to first and second analog input signals in response to a first clock signal, and to first and second reference voltages in response to a second clock signal and digital control signals;

an amplifier having inputs connected to the first and second sets of capacitors in response to the second clock signal; and a reference signal generator connected to the first and second sets of capacitors in response to the first clock signal, to provide a common-mode reference signal during an active phase of the first clock signal to set a common-mode voltage on the first and second capacitors and at the amplifier inputs during an active phase of the second clock signal to a selectable voltage, wherein the reference signal generator generates the common mode reference signal based on the first and second analog input signals, the first and second reference voltages, and the selectable voltage.

3. A switched-capacitor digital-to-analog converter (DAC) circuit, comprising:

first and second sets of capacitors, connected to first and second analog input signals in response to a first clock signal, and to first and second reference voltages in response to a second clock signal and digital control signals;

an amplifier having inputs connected to the first and second sets of capacitors in response to the second clock signal; and a reference signal generator connected to the first and second sets of capacitors in response to the first clock signal, to provide a common-mode reference signal during an active phase of the first clock signal to set a common-mode voltage on the first and second capacitors and at the amplifier inputs during an active phase of the second clock signal to a selectable voltage, wherein the reference signal generator includes replica components to replicate operation of the first and second sets of capacitors and associated switches in response to the first and second clock signals.

4. The switched-capacitor DAC circuit of claim 3, wherein the replica components include a pair of capacitors connected to the first and second analog input signals by a first pair of switches responsive to the first clock signal, and to first and second reference voltages by a second pair of switches responsive to the second clock signal.

5. The switched-capacitor DAC circuit of claim 4, wherein the pair of capacitors each have capacitance values related by a selected scaling factor to the total added capacitance value of the fist and second sets of capacitors.

6. The switched-capacitor DAC circuit of claim 4, wherein first and second pair of switches include transistors having widths and lengths related by a selected scaling factor to widths and lengths of switches connected to the first and second sets of capacitors.

7. The switched-capacitor DAC of claim 1, wherein the reference signal generator includes a second amplifier having a negative input connected by a pair of switches to the pair of capacitors, a positive input to receive the selectable voltage, an output providing a signal representing the common mode reference signal.

8. The switched-capacitor DAC of claim 1, wherein the reference signal generator includes a first negative feedback path including a capacitor between the output and the negative input of the second amplifier, and a second negative feedback path including a switch, responsive to the first clock signal, between the output of the amplifier and the pair of capacitors.

9. The switched-capacitor DAC of claim 1, wherein the active phases of the first and second clock signals are non-overlapping.

10. The switched-capacitor DAC of claim 1, wherein the first clock signal has an active phase in which charge quantities representing the analog input signals are sampled onto the first and second sets of capacitors, and the second clock signal has an active phase in which charge quantities representing a digital input signal provided to or removed from the first and second sets of capacitors as part of performing a subtraction of the digital input from the analog input signal.

11. The switched-capacitor DAC of claim 1, wherein the amplifier provides first and second analog output signals in response to the active phase of the second clock signal, wherein the first and second outputs represent a subtraction of an analog output, corresponding to the digital input signals, from the analog input signals.

12. A pipeline analog-to-digital converter (ADC), comprising:

a plurality of pipeline stages, at least one of the pipeline stages including a switched-capacitor multiplying digital-to-analog converter (MDAC) circuit, the MDAC having:

first and second sets of capacitors, connected to first and second analog input signals by a first set of switches responsive to a first clock signal, and to first and second reference voltages by a second set of switches responsive to a second clock signal and digital control signals;

an amplifier having inputs connected by a third set of switches to the first and second sets of capacitors, the third set of switches responsive to the second clock signal; and a reference signal generator connected by a fourth set of switches to the first and second sets of capacitors, the fourth set of switches responsive to the first clock signal, to provide a common-mode reference signal during an active phase of the first clock signal to set a common-mode voltage on the first and second capacitors and at the amplifier inputs during an active phase of the second clock signal to a selectable voltage.

13. The pipeline ADC of claim 12, wherein the reference signal generator receives, and provides the common mode reference signal based on, the first and second analog input signals, the first and second reference voltages, and the selectable voltage.

14. The pipeline ADC of claim 12, wherein the reference signal generator includes replica components to replicate the operation of the first and second sets of capacitors and the first, second, and third sets of switches in response to the first and second clock signals.

15. The pipeline ADC of claim 14, wherein the replica components include a pair of capacitors connected to the first and second analog input signals by a first pair of switches responsive to the first clock signal, and to first and second reference voltages by a second pair of switches responsive to the second clock signal.

16. The pipeline ADC of claim 15, wherein the pair of capacitors each have capacitance values related by a selected scaling factor to the total added capacitance value of the fist and second sets of capacitors.

17. The pipeline ADC of claim 15, wherein first and second pair of switches include transistors having widths and lengths related by a selected scaling factor to widths and lengths of transistors of the first and second sets of switches connected to the first and second sets of capacitors.

18. The pipeline ADC of claim 12, wherein the reference signal generator includes a second amplifier having a negative input connected by a third pair of switches to the pair of capacitors, a positive input to receive the selectable voltage, an output providing a signal representing the common mode reference signal.

19. The pipeline ADC of claim 12, wherein the reference signal generator includes a first negative feedback path including a capacitor between the output and the negative input of the second amplifier, and a second negative feedback path including a switch, responsive to the first clock signal, between the output of the amplifier and the pair of capacitors.

20. The pipeline ADC of claim 12, wherein the first and fourth sets of switches are enabled in response to an active phase of the first clock signal, and the second and third set of switches are enabled in response to an active phase of the second clock signal.

21. The pipeline ADC of claim 12, wherein the active phases of the first and second clock signals are non-overlapping.

22. The pipeline ADC of claim 12, wherein the first clock signal has an active phase in which charge quantities representing the analog input signals are sampled onto the first and second sets of capacitors, and the second clock signal has an active phase in which charge quantities representing a digital input signal provided to or removed from the first and second sets of capacitors as part of performing a subtraction of the digital input from the analog input signal.

23. The pipeline ADC of claim 12, wherein the amplifier provides first and second analog output signals in response to the active phase of the second clock signal, wherein the first and second outputs represent a subtraction of an analog output, corresponding to the digital input signals, from the analog input signals.

* * * * *

UNITED STATES PATENT AND TRADEMARK OFFICE
CERTIFICATE OF CORRECTION

| | | |
|---|---|---|
| PATENT NO. | : 8,643,527 B2 | Page 1 of 1 |
| APPLICATION NO. | : 13/399843 | |
| DATED | : February 4, 2014 | |
| INVENTOR(S) | : Stephen Robert Kosic | |

It is certified that error appears in the above-identified patent and that said Letters Patent is hereby corrected as shown below:

In the Claims

Column 10, line 58, Claim 1, please change:

"first and second capacitors" to --first and second sets of capacitors--;

Column 11, line 8, Claim 2, please change:

"first and second capacitors" to --first and second sets of capacitors--;

Column 11, line 30, Claim 3, please change:

"first and second capacitors" to --first and second sets of capacitors--;

Column 11, line 46, Claim 5, please change:

"fist and second sets of capacitors" to --first and second sets of capacitors--;

Column 12, lines 37-38, Claim 12, please change:

"first and second capacitors" to --first and second sets of capacitors--;

Column 12, lines 58-59, Claim 16, please change:

"fist and second sets of capacitors" to --first and second sets of capacitors--.

Signed and Sealed this
Eleventh Day of November, 2014

Michelle K. Lee
*Deputy Director of the United States Patent and Trademark Office*